United States Patent
Kopp et al.

(10) Patent No.: US 7,650,897 B2
(45) Date of Patent: Jan. 26, 2010

(54) NOZZLE ARRANGEMENT

(75) Inventors: Lorenz Kopp, Altdorf (DE); Henry Kunze, Wendelstein (DE); Ferdinand Wiener, Burgthann (DE)

(73) Assignee: Atotech Deutschland GmbH, Berlin (DE)

( * ) Notice: Subject to any disclaimer, the term of this patent is extended or adjusted under 35 U.S.C. 154(b) by 702 days.

(21) Appl. No.: 10/536,624

(22) PCT Filed: Nov. 28, 2003

(86) PCT No.: PCT/EP03/13421

§ 371 (c)(1), (2), (4) Date: Oct. 11, 2005

(87) PCT Pub. No.: WO2004/050256

PCT Pub. Date: Jun. 17, 2004

(65) Prior Publication Data

US 2006/0102213 A1 May 18, 2006

(30) Foreign Application Priority Data

Nov. 29, 2002 (DE) .............................. 102 55 884

(51) Int. Cl.
*B08B 3/12* (2006.01)
*B08B 6/00* (2006.01)

(52) U.S. Cl. .................... 134/198; 134/72; 134/86; 239/548

(58) Field of Classification Search ............... 68/213; 134/158, 900, 72, 86, 198
See application file for complete search history.

(56) References Cited

U.S. PATENT DOCUMENTS

| 1,971,376 A | | 8/1934 | Hunt et al. | |
| 3,212,719 A | | 10/1965 | Corpo | |
| 4,132,363 A | | 1/1979 | Kruger | |
| 4,466,574 A | | 8/1984 | Dobson et al. | |
| 4,550,681 A | * | 11/1985 | Zimmer et al. | ............... 118/410 |
| 4,691,722 A | * | 9/1987 | Silvernail et al. | ........... 134/155 |

(Continued)

FOREIGN PATENT DOCUMENTS

CN 1309590 A 8/2001

(Continued)

*Primary Examiner*—Michael Barr
*Assistant Examiner*—Jason Y Ko
(74) *Attorney, Agent, or Firm*—Peter F. Corless; Christine C. O'Day; Edwards Angell Palmer & Dodge LLP

(57) ABSTRACT

A nozzle arrangement is described which may in particular be used as a flow nozzle in galvanization systems with horizontal throughput of printed-circuit boards. The nozzle arrangement comprises a longitudinal housing (2) with at least one fluid feed opening to feed a treatment fluid for treating a work piece, for example a printed-circuit board, and preferably a plurality of slotted fluid delivery openings (8) for releasing the treatment fluid. In the housing (2) a fluid channel (5) is formed for feeding the treatment fluid from the fluid feed opening to the fluid delivery openings (8). In order to achieve the most even possible flow speed of the treatment fluid at the fluid delivery openings (8), (a) the throughput of the fluid channel (5) for the treatment fluid reduces continuously from the fluid feed opening in the longitudinal direction of the housing (2) and/or (b) before the delivery of the fluid from the fluid delivery openings (8) a storage chamber is provided.

32 Claims, 4 Drawing Sheets

U.S. PATENT DOCUMENTS

| | | | |
|---|---|---|---|
| 4,747,541 A * | 5/1988 | Morine et al. | 239/127 |
| 4,789,405 A | 12/1988 | Blasing et al. | |
| 4,846,202 A | 7/1989 | Kallweit | |
| 5,334,352 A | 8/1994 | Johnson | |
| 5,540,247 A | 7/1996 | Kawatani et al. | |
| 5,850,841 A | 12/1998 | Han et al. | |
| 6,250,318 B1 | 6/2001 | Kiat et al. | |

FOREIGN PATENT DOCUMENTS

| | | |
|---|---|---|
| DE | 25 04 856 | 8/1976 |
| DE | 35 28 575 A1 | 2/1987 |
| DE | 37 08 529 | 9/1988 |
| DE | 43 31 496 | 4/1994 |
| EP | 0 253 605 A2 | 1/1988 |
| EP | 0 280 078 | 8/1988 |
| EP | 1 187 515 | 3/2002 |
| JP | 07-161678 | 6/1995 |
| JP | 10-83982 | 3/1998 |
| JP | 3063142 | 8/1999 |
| WO | WO-99/56891 | 11/1999 |

* cited by examiner

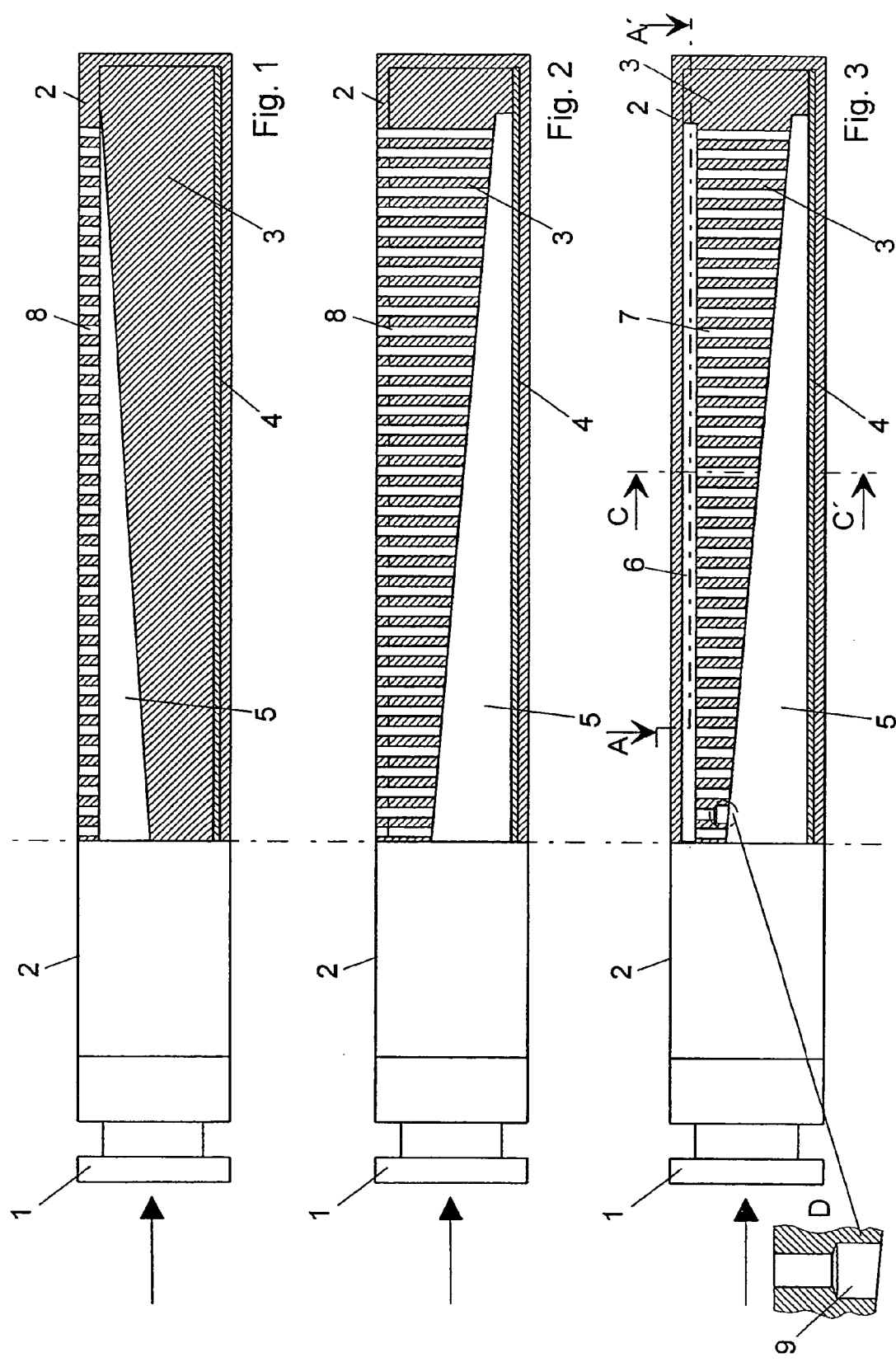

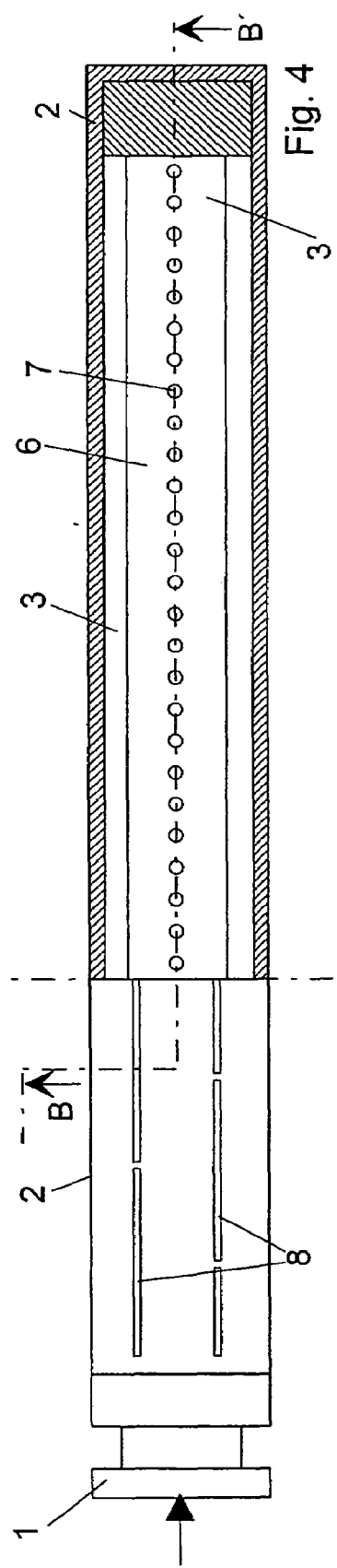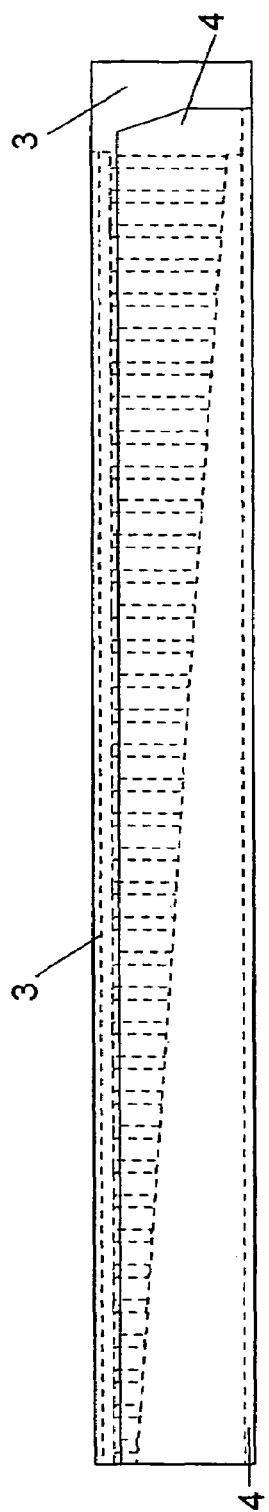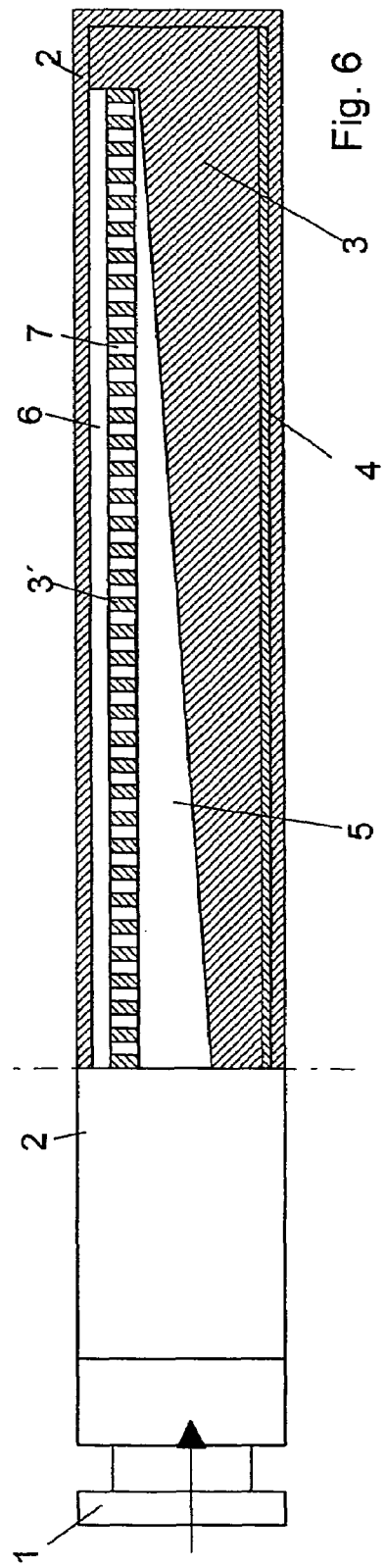

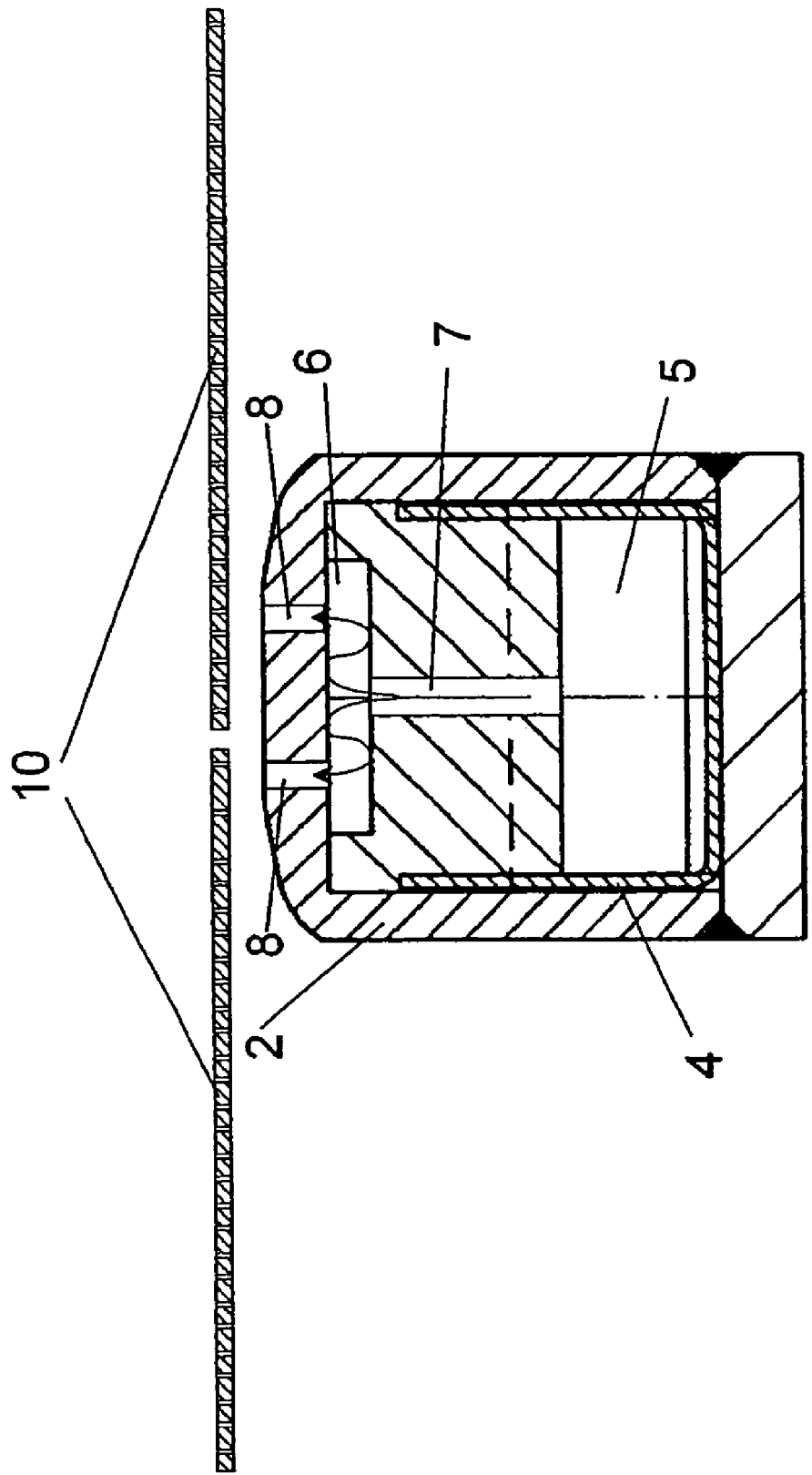

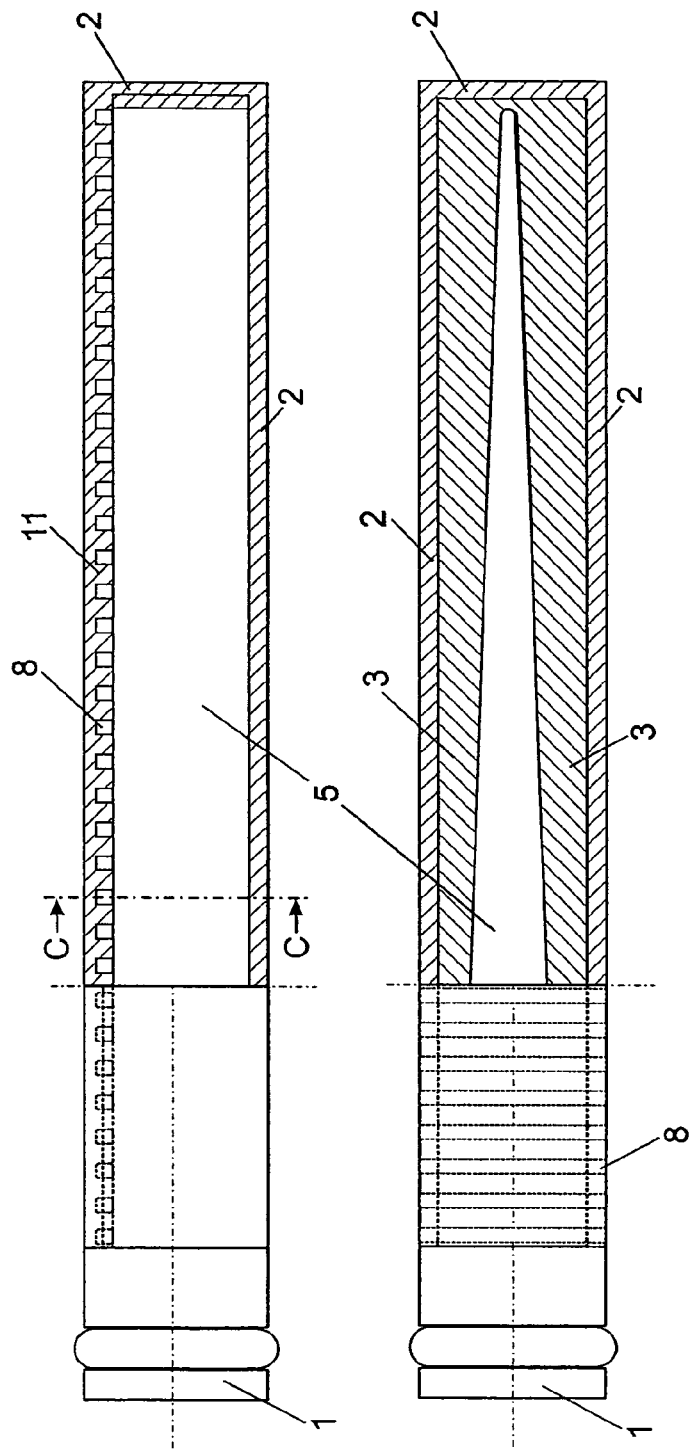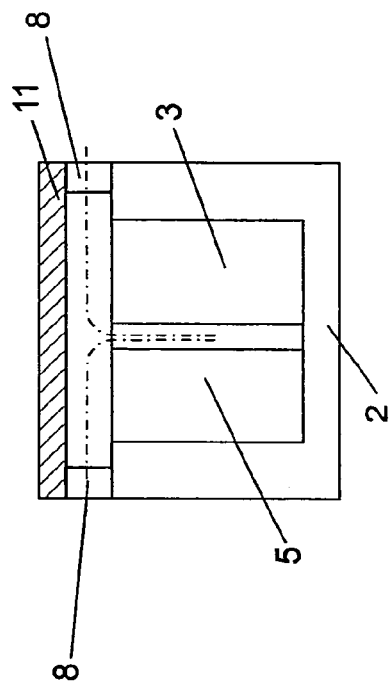

NOZZLE ARRANGEMENT

The present invention concerns a nozzle arrangement, as may be applied in the treatment of a work piece with a treatment fluid or in the flooding of a corresponding treatment bath with a treatment fluid. In particular the present invention concerns a flow nozzle arrangement which can, for example, be applied in continuous systems for wet-chemical treatment of printed-circuit boards.

Nozzle arrangements of the type mentioned are widely known. Thus, for example, such nozzle arrangements are used in continuous systems for wet-chemical treatment of printed-circuit boards in order to achieve the fastest and most even possible treatment of the printed-circuit boards passing through. For this purpose in a known fashion various such nozzle arrangements are arranged above and/or below the level at which the printed-circuit boards pass through as well as diagonally to this direction of flow of the printed-circuit boards, from which the corresponding treatment fluid is sprayed onto the surface of the printed-circuit board or is sucked from it, in order to achieve a constant and even exchange of the treatment fluid along the surface of the printed-circuit boards.

In EP 1 187 515 A2 a number of different nozzle arrangements are proposed in this connection. Here essentially round tubes are used that have various nozzle forms. Thus these nozzle arrangements may, for example, have slot nozzles arranged diagonally, round nozzles arranged alongside each other in rows or also a number of slot nozzles arranged alongside each other and running in an axial direction.

DE 37 08 529 A1 also proposes the use of slot nozzles, whereby by means of a variable slot width of the corresponding nozzle the flow quantity and the spray pressure of the respective medium can be adjusted.

In DE 35 28 575 A1 for cleaning, activation and/or metallization of bore holes in printed-circuit boards passing through horizontally a nozzle below the level at which these pass through and vertically to the direction of flow is used, from which a fluid treatment means in the form of a constant wave is delivered onto the underside of each printed-circuit board that passes through. The nozzle is arranged in the top part of a nozzle housing, which comprises a pre-chamber with inlet nozzle, whereby the pre-chamber is, in turn, separated from an upper part of the inner area of the nozzle by means of a shadow mask. With the help of the shadow mask a distribution of the flow of the fluid treatment means to the nozzle is achieved. The inner area of the nozzle before the actual (slot) nozzle serves as the pre-chamber for an even build-up of the flow of the fluid treatment means.

EP 0 280 078 B1 reveals a nozzle arrangement for cleaning or chemical treatment of work pieces, in particular printed-circuit boards, by means of a corresponding treatment fluid. The nozzle arrangement comprises a lower admission box and a housing box, whereby via the lower admission box the treatment fluid is passed via bore holes in the floor of the housing box into the inside of the housing box. The housing box, in turn, has a central separating wall in combination with two perforation levels and slots arranged on this, which allows the treatment fluid to flow to both slots and via these to form two even, sinusoidal surge wave profiles, which the work pieces, in particular the bore holes of printed-circuit boards, pass through, and by means of the Venturi effect ensure an intensive mass transfer.

In the known flow nozzle arrangements the speed of flow at the inlet is at a maximum, since it is here that the greatest flow volume passes through. With increasing distance from the inlet the flow speed drops accordingly, since via each of the individual nozzle openings only part of the treatment fluid discharges. Apart from the existing static pressure, this leads to banking-up pressure and uneven flow speeds at the nozzle openings. A further consequence is unevenness in the quantities of the treatment fluid discharged.

The object of the present invention is therefore to provide a nozzle arrangement for releasing a treatment fluid, in which an extensively even flow speed and flow quantity of the treatment fluid in the longitudinal direction of the nozzle arrangement can be achieved. Further requirements that are preferably to be met are a high level of compactness of the nozzle section, in order to use the smallest possible amount of space in systems of the abovementioned type. Apart from this, the number of components and the production costs should be kept low. In addition the spray or flow geometry and the spray direction should preferably be the same at all discharge openings.

The object is achieved according to the invention by a nozzle arrangement as described herein. Preferred and advantageous embodiments of the present invention are also described.

The nozzle arrangement according to the invention has an elongated housing with at least one fluid feed opening for the feeding of a treatment fluid and with at least one fluid delivery opening formed in the housing for releasing the treatment fluid onto the work piece to be treated. In the housing a fluid channel is formed for feeding the treatment fluid from the fluid feed opening to the at least one fluid delivery opening. The minimum of one delivery opening can be slotted or be designed as a row of round bore holes arranged behind one another with an even spacing.

According to a first embodiment of the present invention the section of the fluid channel reduces from the fluid feed opening in the longitudinal direction of the housing, whereby a continuous reduction in the section of the fluid channel in the longitudinal direction and along the minimum of one fluid delivery opening can be provided. By means of this adaptation of the flow section of the fluid channel to the distance from the fluid feed opening or from the fluid inlet, where the greatest fluid quantity passes through, balancing of the flow speed along the entire length of the nozzle arrangement and thus along the at least one fluid delivery opening can be achieved.

In a housing with the same section in the longitudinal direction a longitudinal insert can be provided, the section of which reduces in the longitudinal direction from the fluid feed opening, so that it reduces according to the section of the fluid channel. The insert is preferably arranged in relation to the fluid delivery openings in such a way that all fluid delivery openings have delivery channels of the same length.

It is also equally possible, however, for the thickness of the housing wall to increase at one or more points in the longitudinal direction of the housing from the fluid feed opening.

The insert in the inside of the nozzle arrangement can, for example, also comprise a large number of individual sections or segments. These may be displacers or perforated bodies. In this way, for example, 60 parts per nozzle arrangement, depending on the required length, with differing section, or for discs with a differing inside diameter, are arranged in a row. The individual sections can be glued, welded, or held together with tie rods or with a stiffener. The flow cross section for the fluid decreases constantly here from section to section from the first segment at the fluid entry to the end of the nozzle arrangement. If, for example, one of the sections has a delivery opening, the storage chamber in the section can be cylindrical and not conical. This results in a stepped fluid channel with very low production costs.

According to a second embodiment of the present invention the fluid channel communicates via several distribution openings separated from one another in the longitudinal direction of the housing, and which differ in length. If the length of these distribution openings is increasingly altered starting from the fluid feed opening in the longitudinal direction of the housing, then likewise balancing of the speed of flow of the treatment fluid over the entire length of the nozzle arrangement at the nozzle or fluid delivery openings can be achieved. The differing lengths of the bore holes or distribution openings result in differing flow resistances which lead to a balancing of the flow speed.

The abovementioned distribution openings can all have the same diameter. Similarly, however, it is also conceivable for the distribution openings to be designed with differing diameters. The decisive factor for the change in diameter is a differing flow speed in the feed channel and the associated differing overall pressure conditions.

According to a further variant, therefore, it is proposed that the distribution openings have differing diameters at the fluid delivery and that these are provided with countersinkings with the same diameters. If the diameter of the countersinkings is selected to be identical, then a further evening out of the volume flow and the delivery speed takes place.

The above distribution openings can be fashioned in an insert of the abovementioned type in the form of corresponding bore holes. The insert can be retained with the help of a preferably U-shaped stiffener in the housing.

It has been observed that through the dynamic forces of the flowing fluid the jet is not delivered at the fluid delivery openings in the angle of the opening channel, but diagonally in the direction of flow of the treatment fluid. With increasing length of the delivery channel this effect reduces. This likewise leads to an uneven treatment result on the sensitive treatment product.

It is therefore particularly advantageous if between the at least one fluid delivery opening and the fluid channel a storage chamber is provided, for example in the form of a corresponding milling or recess of the aforementioned insert, which serves to further distribute the pressure and to reduce the dynamic forces. The distribution openings are arranged in a preferred embodiment in such a way that the jet of fluid delivered bounces against the wall in which the fluid delivery openings are arranged. Then the jet is deflected diagonally and bounces against the wall of the milled-out insert, before flowing against the treatment product or work piece once it has been deflected again by the fluid delivery opening.

The fluid delivery opening or the inlet for the treatment fluid can be arranged on a longitudinal side of the housing. It is, of course, conceivable for this fluid delivery opening to be arranged in a central section of the housing however.

The fluid delivery openings are preferably in the form of several slots arranged at intervals in the longitudinal direction of the housing which can all have identical dimensions or also different dimensions. It is particularly advantageous if the fluid delivery openings are designed in the form of several rows of slots offset against each other, which each run in the longitudinal direction of the housing. In place of the offset rows of slots, however, rows of bore holes can also be used. In both cases an even flow against the treatment product takes place.

It is also important that the distance from the fluid delivery openings and the treatment product is always the same. This should avoid the nozzle arrangement bending under the build-up or jet pressure of the treatment fluid. High temperatures or deformations caused by the production process (e.g. those brought about by welding) should also be avoided. The required stability can in particular be achieved by having longitudinally arranged metal stiffeners on or in the nozzle arrangement.

According to a further embodiment, the nozzle arrangement according to the invention can also have a preferably bilaterally continuously reducing section of the fluid channel, whereby on one side of the housing a fluid-tight lid or covering is arranged on the housing which together with the housing defines the fluid delivery openings. According to this embodiment the fluid delivery openings, in particular, comprise a plurality of slots arranged in the longitudinal direction of the nozzle arrangement at intervals and which run diagonally to the longitudinal direction, i.e. in the width direction of the nozzle arrangement, whereby the fluid delivery openings are arranged bilaterally on the nozzle arrangement. Each slot or connecting channel thus communicates at one end with the fluid channel of the housing and at the other flows into each of two fluid delivery openings.

This embodiment is particularly well suited to the totally even flooding of treatment baths with a treatment fluid or a treatment medium. In certain processes where there is a danger of substances being absorbed from the environment, such as for example oxygen from the air, the flooding must be carried out as far as possible without the formation of jets or vortexes that could increase the surface area of the treatment fluid. This object is achieved by the nozzle arrangement according to the embodiment described above by an even, slow flow speed over the entire effective length of the nozzle arrangement.

The last embodiment given can be combined with the features of the embodiments described before it. Of course the last embodiment given may also be constructed without the features described above concerning the creation of a storage chamber or the use of distribution openings, etc.

The nozzle arrangement according to the invention is preferably suited to use as a flow nozzle in wet-chemical systems with a horizontal throughput of the printed-circuit boards. The present invention is not, of course, limited to this preferred range of application, however. It can be used wherever a work piece has to have a flow against it from a nozzle arrangement of a treatment fluid, for example also for cleaning or chemical treatment etc. of the work piece or wherever the most even possible flooding of a treatment bath with a treatment fluid of this kind has to be possible. In its most generalized form, therefore, the invention can be used wherever the most even possible release of a treatment fluid is desired.

The present invention is explained in more detail in the following with reference to the attached drawings on the basis of a preferred embodiment.

FIG. 1 shows a side view of a nozzle arrangement according to the invention in a simple form in partial section along a line of intersection B-B' illustrated in FIG. 4.

FIG. 2 shows a side view of a nozzle arrangement according to the invention as an alternative to FIG. 1 in the partial section along the line of intersection B-B' illustrated in FIG. 4.

FIG. 3 shows a side view of a nozzle arrangement according to the invention in a preferred embodiment with additional storage chamber for pressure distribution in the partial section along the line of intersection B-B' illustrated in FIG. 4.

FIG. 4 shows a top view of the nozzle arrangement illustrated in FIG. 3 in the partial section along a line of intersection A-A' illustrated in FIG. 3.

FIG. 5 shows a side view of an insert illustrated in FIG. 3 and FIG. 4 as well as a stiffener for retaining this insert in the nozzle arrangement.

FIG. 6 shows a side view of a nozzle arrangement according to the invention in an alternative design to FIG. 3 or FIG. 4 in the partial section along the line of intersection B-B' illustrated in FIG. 4.

FIG. 7 shows a cross-sectional view of the nozzle arrangement of FIG. 3 along a line of intersection C-C' illustrated in FIG. 3.

FIG. 8 shows a side view of a nozzle arrangement according to the invention according to a further embodiment in the form of a partial section.

FIG. 9 shows a top view of the nozzle arrangement illustrated by FIG. 8 in partial section, and FIG. 10 shows a sectional view of the nozzle arrangement from FIG. 8 and FIG. 9 along a line of intersection C-C illustrated in FIG. 8.

The nozzle arrangement illustrated in FIG. 1, which is particularly suited as a flow nozzle for galvanisation systems with a horizontal throughput of printed-circuit boards, comprises an essentially parallelepiped-shaped housing 2. On a rear face of the housing 2 a connecting sleeve 1 coupled to a fluid feed opening of the housing is arranged for the feeding of a treatment fluid. On a side face of the housing 2 arranged opposite the work piece to be treated or the treatment product rows of slots or of bore holes offset from one another are arranged that form the delivery openings 8 for the treatment fluid. In the embodiments illustrated all slotted delivery openings or bore holes 8 have the same dimensions and accordingly the same length and width or diameter. Differing dimensions can also be selected, however, in order to generate a predefined spray or flow picture.

In the inside of the housing 2 a wedge-shaped insert 3, which is preferably made from plastic is arranged, along with a U-shaped stiffener 4 for stabilising this insert 3 that is made from a metal that is resistant to the chemicals used, such as special steel, titanium, niobium or similar.

As described in more detail in the following, the purpose of the insert 3 is to balance the flow speed in the fluid channel and thus to evenly distribute the treatment fluid over the entire length of the nozzle arrangement.

As can be seen from FIG. 1, in particular, the insert 3 runs conically in the longitudinal direction, so that at its end arranged adjoining the connecting sleeve 1 it has the lowest thickness and at its opposite end the greatest thickness. Between the insert 3 and the stiffener 4 there is a hollow space that serves as the fluid channel 5 for the treatment fluid. At the end coupled to the connecting sleeve 1, the flow section of this fluid channel 5 is accordingly at its greatest and decreases continuously towards the opposite end, where the flow section is at its least.

The nozzle arrangement has, on the surface opposite to the treatment product and along its length the preferably evenly spaced delivery openings 8 in the form of through holes, which in the embodiment illustrated all have the same diameter. In place of the bore holes illustrated slotted delivery opening can also be used.

As can be seen, again, from FIG. 1, the length of these delivery openings 8 is the same over the entire length of the nozzle arrangement. The treatment fluid is passed through the nozzle arrangement in the direction of the arrow via the connecting sleeve 1 into the fluid channel 5 and in the longitudinal direction to the delivery openings 8.

Since on account of the wedge-shaped insert 3 the flow speed at all points of the fluid channel 5 is the same and all delivery openings 8 have the same dimensions, a very even spray picture results.

According to FIG. 2, the wedge-shaped insert is arranged in the top part of the nozzle arrangement. The delivery openings 8 are present in the housing 2 and in the insert 3 identically. This results in delivery channels of differing lengths but with the same diameter of delivery openings. The differing length delivery channels can be used for a further balancing of the spray picture. In the longer bore holes at a greater distance from the fluid inlet there is an increased flow resistance towards the end, which provides a further balancing of the flow conditions.

According to FIG. 3 in an insert 3 there is a milling or a recess and in the longitudinal direction of the insert 3 distribution openings 7 are formed at intervals from each other. The milling or the recess on the insert 3 creates between the distribution openings 7 of the insert 3 and the slotted delivery openings 8 formed in the housing 2 (not illustrated in this figure) a storage chamber 6 for the treatment fluid, which serves to further distribute the pressure. The fluid jet emitted from each distribution opening 7 is initially emitted against the housing wall, diverted diagonally downwards from here against the wall of the insert 3 before, following a further change of direction, emerging from the slotted delivery opening 8 onto the treatment product 10. This deviation is intended to release the dynamic force of the moving fluid.

FIG. 7 shows as section C-C', illustrated in FIG. 3, further details of the nozzle arrangement.

The distribution openings 7 have differing lengths due to the wedge-shaped insert 3. If this difference in length proves troublesome the bore holes can be provided with countersinkings 9 of differing length in accordance with detail D (illustrated in FIG. 3) in order to adjust the flow conditions.

A combination of the continuously reducing fluid channel 5 from the feed opening to the opposite end of the nozzle arrangement communicating with the storage chamber 6 and the multiple deviations of the fluid flow before delivery from the delivery openings 8 (e.g. a row of slots) ensures that the same quantity of fluid emerges from each slot and at the same discharge speed.

As can be seen from FIG. 5, the stiffener 4 essentially runs along the entire length of the insert 3. At the outer end of the stiffener the thickness of the insert 3 is increased by the wall thickness of the stiffener. This ensures a tight seal on the fluid channel 5 in the inside of the housing 2 of the nozzle arrangement (see also FIG. 3). The insert 3 is also thicker by the same amount along its top side, so that it sits securely on the U-shaped stiffener 4, as can be seen from FIG. 7. It is also possible, however, to position the U-shaped stiffener on the outside of the housing 2. To this end the additional thickness on the insert 3 can be dispensed with. The stiffener can also be secured to the housing by means of screws, for example. The screws should not, however, protrude into the fluid channel 5.

In the embodiments illustrated in FIGS. 3-7 an even flow speed of the treatment fluid at the outlet openings 8 is in principle achieved by two measures. Firstly, the throughput section for the treatment fluid decreases continuously inside the nozzle arrangement, that is in the fluid channel 5, from the connecting sleeve 1 to the end of the nozzle arrangement due to the insert 3 that runs diagonally. Secondly, the distribution openings 7 do not carry the treatment fluid directly to the treatment product. Instead it is twice diverted and only then is it delivered via the fluid delivery openings 8, in this example rows of slots.

The flow resistance in the distribution openings 7 increases continuously because of their increasing length. In order that this does not have any effect on the fluid distribution, the inclination of the insert 3, illustrated in FIGS. 2, 3 and 5, is preferably selected to be somewhat flatter so that a gap still remains at the end of the nozzle arrangement. In the example in FIG. 3 the gap height at the end is approximately 4 mm.

A combination of the two measures (inclined or tapered insert and fluid deviation in the additional storage chamber) leads to the best results, since the reduction in section of the fluid channel 5 alone can possibly only bring about an inadequate pressure equalisation and the jets emerge diagonally. Since with this combination the delivery openings 8 preferably all have the same widths or diameters, the same volume of fluid per unit of time flows from all the delivery openings.

FIG. 6 shows a further example of a nozzle arrangement with a storage chamber 6. Here two inserts 3, 3' are present. Insert 3 is, as already described, wedge-shaped and fitted in the bottom section of the nozzle arrangement. Insert 3' in the top part of the nozzle arrangement has the same section along its entire length. In insert 3' there are distribution bore holes 7. These all have the same length. Accordingly, the wedge-shaped fluid channel is steeper at the end than illustrated in FIGS. 2, 3 and 5.

Nevertheless, by taking just one of the two measures described above it may be possible in a particular application to achieve a sufficiently even flow speed of the treatment fluid to the delivery openings 8.

Of course, a number of modifications to the embodiments illustrated in the figures are conceivable, without deviating from the basic ideas of the invention. Thus, for example, the connecting sleeve 1 could be moved to the middle of the housing 2 of the nozzle arrangement, so that the feed of the treatment fluid takes place centrally. With this variant the throughput section of the fluid channel 5 inside the housing 2 from the central connecting sleeve 1 to both ends of the housing 2, i.e. bilaterally, would decrease and the thickness of the insert 3, correspondingly from the central connecting sleeve 1 to the two ends would increase in width, so that the length of the distribution openings 7 in the insert 3 also increases bilaterally.

Furthermore, in the embodiments illustrated the continuously reducing throughput section of the fluid channel 5 is achieved solely through the increasing width of the insert 3. It is, of course, also conceivable for several side faces of the fluid channel 5 to be increasingly broadened in the longitudinal direction of the housing 2. On top of this it may be possible to dispense with the storage chamber 6 for further pressure distribution.

In order to improve the evenness of the flow speed the slotted delivery openings 8 may also have a different width, whereby the width, in particular in the longitudinal direction of the housing 2, can decrease from the inlet sleeve 1. This generally leads to differing volume flows that may cause varying results on the treatment product.

Notwithstanding the embodiments illustrated the distribution openings 7 may also be designed with differing diameters, whereby in order to create a continuously increasing flow resistance in particular a continuous reduction in the diameter of the distribution openings 7 is conceivable, since towards the end of the nozzle arrangement the overall pressure is at its highest.

On the side of the distribution openings 7 bordering the fluid channel 5 the former can be provided with countersinkings 9 with a larger diameter (see FIG. 3). In order to create a continuously increasing flow resistance in the longitudinal direction of the housing 2 these countersinkings can have a different depth, in particular a depth that continuously increases in the longitudinal direction of the housing 2.

It may also be possible to dispense with the stiffener 4 illustrated in the drawing. It is also conceivable that the insert 3 and the housing 2 are built as a single piece. Finally, it should be mentioned that with the embodiment illustrated a number of delivery openings 8 are in fact provided at intervals in the longitudinal direction of the housing 2, which are in particular evenly spaced and arranged in two rows of slots that are arranged with an offset to one another, whereby in principle, however, a proper and satisfactory operability of the nozzle arrangement is also guaranteed with simply an, in particular, longitudinal delivery opening 8, for example with just a slotted delivery opening 8 extending in the longitudinal direction of the housing 2.

FIGS. 8-10 illustrate a further nozzle arrangement according to an embodiment of the present invention, whereby FIG. 8 illustrates a side view of the nozzle arrangement on the partial section, FIG. 9 a top view of the nozzle arrangement in the partial section and FIG. 10 a sectional view of the nozzle arrangement along a line of intersection C-C shown in FIG. 8.

The nozzle arrangement shown in FIGS. 8-10 concerns an embodiment which is particularly well-suited to the even flooding of treatment baths with a treatment fluid. In certain processes where there is a danger of substances being absorbed from the environment, such as oxygen from the air, the flooding must be carried out as far as possible without the formation of jets or vortexes that could increase the surface area of the treatment fluid. The nozzle arrangement illustrated in FIGS. 8-10 achieves this by an even, slow flow speed over the entire effective length of the nozzle arrangement.

The nozzle arrangement illustrated in FIGS. 8-10 comprises, like the embodiments described previously, a connecting sleeve 1 and a longitudinal, essentially parallelepiped housing 2, in which an insert 3 is fitted, which defines a fluid channel 5 with a section that reduces continuously in the longitudinal direction of the nozzle arrangement or the housing 2. In this connection, it can be seen in particular from FIG. 9 that the insert 3 bilaterally reduces the section of the fluid channel 5, whereby the section of the fluid channel 5 is continuously and evenly reduced from the connecting sleeve 1 to the end of the nozzle arrangement, so that in the fluid channel 5 itself approximately the same flow speed of the treatment fluid always exists.

On one side of the housing 2 a fluid-tight lid or covering 11 is arranged on the housing by means of a suitable jointing method such as welding or gluing. As can be seen from FIG. 8 and FIG. 9, on its underside the covering 11 has a number of slots or connecting channels running diagonally to the longitudinal direction of the nozzle arrangement, which in particular are spaced evenly along the entire effective length of the nozzle arrangement. These slots in the lid 11, together with the housing 2, from fluid delivery openings 8 for the treatment fluid.

As can be seen from FIG. 10, with this embodiment the treatment fluid fed via the connecting sleeve 1 of the nozzle arrangement, from the fluid channel 5 via the slots formed in the lid 11 can be delivered at the fluid delivery openings 8 provided bilaterally on the nozzle arrangement or the housing 2.

Of course, the nozzle arrangement illustrated in FIGS. 8-10 can also be combined with the features of the nozzle arrangement described previously using FIGS. 1-7.

The description of the nozzle arrangement according to the invention involves, in all the embodiments, the transport of the treatment fluid from the nozzle arrangement to the treatment product. The nozzle arrangement functions in the same way as well for the sucking of the treatment fluid from the treatment product into the nozzle arrangement. If during the treatment decomposition products result or solid matter is applied, this form of electrolyte transport is particularly advantageous. By sucking the treatment liquid into the nozzle arrangement the decomposition products or solid matter are entrained and thus reach a regeneration unit or a filter that removes the solid matter, as quickly as possible. Interference with the treatment results by this matter is thus virtually excluded.

| Reference list | | |
|---|---|---|
| 1. | Connecting sleeve | |
| 2. | Housing | |
| 3. | Insert | |
| 4. | Stiffener | |
| 5. | Fluid channel | |
| 6. | Storage chamber | |
| 7. | Distribution openings (distribution bore holes) | |
| 8. | Fluid delivery openings | |
| 9. | Countersinkings | |
| 10. | Treatment product | |
| 11. | Lid | |

The invention claimed is:

1. Nozzle arrangement for releasing a treatment fluid, comprising:
a longitudinal housing with at least one fluid feed opening for feeding the treatment fluid and at least one fluid delivery opening formed in the housing for releasing the treatment fluid,
whereby in the housing a fluid channel is formed for feeding the treatment fluid from the fluid feed opening to the at least one fluid delivery opening, and whereby an inner cross-section of the fluid channel reduces moving away from the fluid feed opening in the longitudinal direction of the housing,
wherein
the housing is made from plastic, and at or in the nozzle arrangement at least one stiffening member made from metal and extending in the longitudinal direction of the nozzle arrangement is provided,
in the nozzle arrangement a longitudinal insert, in which a plurality of distribution openings spaced from one another in the longitudinal direction is formed, wherein the longitudinal insert is adjoining the longitudinal housing such that the plurality of distribution openings are in fluid communication with the at least one fluid delivery opening,
the insert extends within the housing and is arranged so that the fluid channel defined by the insert is in communication with the at least one fluid delivery opening via the distribution openings, in order to feed the treatment fluid from the fluid channel via the distribution openings to the at least one fluid delivery opening and
as the insert increases in thickness moving away from the fluid feed opening of the housing, the fluid channel reduces.

2. Nozzle arrangement according to claim 1, wherein
the section of the fluid channel reduces continuously from the fluid feed opening in the longitudinal direction of the housing.

3. Nozzle arrangement according to claim 1, wherein
the distribution openings of the insert are positioned congruent to the fluid delivery openings in the housing.

4. Nozzle arrangement according to claim 1, wherein
the section of the fluid channel reduces from the fluid feed opening in the longitudinal direction of the housing from a number of sides.

5. Nozzle arrangement according to claim 1, wherein
all the distribution openings have the same diameter.

6. Nozzle arrangement according to claim 1, wherein
the length of the distribution openings increases from the fluid feed opening in the longitudinal direction of the housing.

7. Nozzle arrangement according to claim 1, wherein
the length of the distribution openings of the fluid feed opening in the longitudinal direction of the housing is the same.

8. Nozzle arrangement according to claim 1, wherein
the distribution openings have a differing diameter.

9. Nozzle arrangement according to claim 8, wherein
the diameter of the distribution openings reduces from the fluid feed opening in the longitudinal direction of the housing.

10. Nozzle arrangement according to claim 1, wherein
the distribution openings are provided with countersinkings on their side turned towards the fluid channel.

11. Nozzle arrangement according to claim 1, wherein
the countersinkings of the distribution openings have a different depth.

12. Nozzle arrangement according to claim 11, wherein
the depth of the countersinkings of the distribution openings increases from the fluid feed opening in the longitudinal direction of the housing.

13. Nozzle arrangement according to claim 1, wherein
the housing is parallelepiped in shape and the stiffening member is U-shaped.

14. Nozzle arrangement according to claim 1, wherein
between the at least one fluid delivery opening and the fluid channel and immediately before the at least one fluid delivery opening a storage chamber is formed for pressure distribution.

15. Nozzle arrangement according to claim 14, wherein
the storage chamber is in the form of a recess provided in the longitudinal insert on the side of the distribution openings turned towards the at least one fluid delivery opening.

16. Nozzle arrangement according to claim 15, wherein
all distribution openings are arranged spatially at an offset to the at least one fluid delivery opening in such a way that the treatment fluid flows out of the fluid delivery openings via the storage chamber only after at least two changes in direction.

17. Nozzle arrangement according to claim 1, wherein
the at least one fluid feed opening is provided at a longitudinal end of the housing.

18. Nozzle arrangement according to claim 1, wherein
the at least one fluid feed opening is provided at a middle section of the housing.

19. Nozzle arrangement according to claim 1, wherein
the housing has a plurality of fluid delivery openings spaced from one another in the longitudinal direction of the housing.

20. Nozzle arrangement according to claim 19, wherein
the fluid delivery openings are slotted or round.

21. Nozzle arrangement according to claim 19, wherein
the fluid delivery openings have the same dimensions.

22. Nozzle arrangement according to claim 19, wherein
the fluid delivery openings have a reducing width from the fluid feed opening over the length of the housing or a reducing diameter over the length of the housing.

23. Nozzle arrangement according to claim 19, wherein
the fluid delivery openings are slotted and are formed in a plurality of rows offset from one another in the housing.

24. Nozzle arrangement according to claim 1, wherein
in the housing a plurality of connecting channels spaced from one another and extending widthways in the housing are formed in the longitudinal direction of the housing, which communicate at one end with the fluid channel in the housing and at the other with the at least one fluid delivery opening.

25. Nozzle arrangement according to claim 1, wherein
in a cover which is positioned on the housing, a plurality of connecting channels spaced from one another and extending widthways are formed in the longitudinal direction of the housing, the connecting channels communicating at one end with the fluid channel in the housing and at the other with the at least one fluid delivery opening.

26. Nozzle arrangement according to claim 25, wherein
the cover is positioned with a fluid-tight seal at the housing.

27. Nozzle arrangement according to claim 24, wherein
the connecting channels are arranged evenly spaced in the longitudinal direction of the housing.

28. Nozzle arrangement according to claim 24, wherein
the connecting channels are distributed over the entire length of the housing.

29. Nozzle arrangement according to claim 24, wherein
each connecting channel extends in a straight line transversely to the longitudinal direction of the housing.

30. Nozzle arrangement according to claim 24, wherein
each connecting channel opens out into one of the fluid delivery openings at either side of the housing.

31. A nozzle arrangement for releasing a treatment fluid comprising:
an elongated housing having a wall defining an interior with at least one fluid feed inlet for receiving the treatment fluid in a proximal end, at least one transverse fluid delivery outlet for releasing the treatment fluid, and a portion of a fluid channel for feeding the treatment fluid from the fluid feed inlet to the at least one fluid delivery outlet;
at least one stiffening member against the wall within the interior and extending along a first portion of the fluid channel; and
a longitudinal insert adjoining the wall within the interior and extending along a second portion of the fluid channel, the longitudinal insert defining a plurality of transverse distribution openings spaced from one another in a longitudinal direction such that the distribution openings are aligned with the at least one fluid delivery outlet in order to feed the treatment fluid from the fluid channel thereto and wherein the insert is wedge-shaped with a relatively narrow end near the proximal end.

32. Nozzle arrangement for releasing a treatment fluid, comprising:
a longitudinal housing with at least one fluid feed opening for feeding the treatment fluid and at least one fluid delivery opening formed in the housing for releasing the treatment fluid,
whereby in the housing a fluid channel is formed for feeding the treatment fluid from the fluid feed opening to the at least one fluid delivery opening, and whereby an inner cross-section of the fluid channel reduces moving away from the fluid feed opening in the longitudinal direction of the housing,
wherein
at or in the nozzle arrangement at least one stiffening member is provided which extends in the longitudinal direction of the nozzle arrangement,
within the housing, the fluid channel is defined by a first longitudinal insert and a second longitudinal insert,
the first longitudinal insert is wedge-shaped and as it increases in thickness moving away from the fluid feed opening of the housing, the fluid channel reduces,
the second longitudinal insert has a constant thickness in the longitudinal direction of the housing, and is arranged such that a plurality of distribution openings spaced from one another in the longitudinal direction is formed, and
the second longitudinal insert is arranged and extends within the housing such that the plurality of distribution openings are in fluid communication with the at least one fluid delivery opening so that the fluid channel is in communication with the at least one fluid delivery opening via the distribution openings, in order to feed the treatment fluid from the fluid channel via the distribution openings to the at least one fluid delivery opening.

* * * * *